(12) United States Patent
Dong et al.

(10) Patent No.: US 7,348,239 B2
(45) Date of Patent: Mar. 25, 2008

(54) SEMICONDUCTOR DEVICE AND METHOD OF MANUFACTURING THE SAME

(75) Inventors: Cha Deok Dong, Icheon-si (KR); Seung Woo Shin, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 95 days.

(21) Appl. No.: 11/454,587

(22) Filed: Jun. 16, 2006

(65) Prior Publication Data

US 2007/0117316 A1    May 24, 2007

(30) Foreign Application Priority Data

Nov. 21, 2005  (KR) .................. 10-2005-0111327

(51) Int. Cl.
*H01L 21/336* (2006.01)

(52) U.S. Cl. ..................................... 438/257; 257/261

(58) Field of Classification Search ............... 438/201, 438/288, 573, 652, 257; 257/314–316, 319, 257/324, 261
See application file for complete search history.

(56) References Cited

U.S. PATENT DOCUMENTS 6,329,248 B1 *  12/2001  Yang ........................ 438/267
6,734,066 B2 *   5/2004  Lin et al. .................. 438/259

FOREIGN PATENT DOCUMENTS

KR       2004-0043284 A    5/2004

\* cited by examiner

*Primary Examiner*—Mary Wilczewski
*Assistant Examiner*—Swapneel Chhaya
(74) *Attorney, Agent, or Firm*—Marshall, Gerstein & Borun LLP

(57) ABSTRACT

A semiconductor device and a method of manufacturing the same, wherein first and second gate electrodes are formed to have a spacer shape. The length of an underlying dielectric film can be automatically controlled. A gate oxide film and a third gate electrode are formed between the first and second gate electrodes. Voids are not generated when burying the third conductive film. A thickness and width of the gate oxide film can be freely controlled.

4 Claims, 6 Drawing Sheets

SEMICONDUCTOR DEVICE AND METHOD OF MANUFACTURING THE SAME

BACKGROUND

1. Field of the Invention

The invention relates generally to a method of manufacturing semiconductor devices and, more particularly, to semiconductor devices and a method of manufacturing the same, in which a self-aligned electron trap film capable of securing a right and left-symmetrical type ONO film length can be formed.

2. Discussion of Related Art

In recent years, silicon-oxide-nitride-oxide-silicon (SONOS) type flash memory devices have been developed along with the development of flash memory devices. The SONOS type flash memory device is advantageous in that it can be easily fabricated and can be easily integrated with the peripheral region of such a device.

In the existing SONOS type flash memory device, an oxide-nitride-oxide (ONO) film (i.e., a dielectric film) exists entirely on a channel region. This thickens a gate oxide film formed on the ONO film. As a result, the SONOS type flash memory device has a high threshold voltage (Vt), and high power consumption and a high program voltage corresponding to the high threshold voltage.

Furthermore, electrons trapped at the silicon nitride film are moved in a horizontal direction in the silicon nitride film. Accordingly, the erase operation is not fully performed, and the erase rate is lengthened. On the other hand, as the program and erase operations are repeatedly performed, an initial threshold voltage (Vt) of an erased cell is increased. This can lower not only the cell current and the read speed, but also the data retention time.

To solve the problems, there has been proposed local SONOS type (i.e., electron trap film) flash memory devices in which the silicon nitride film is locally overlapped with the gate electrode. A gate formation method of the local SONOS type flash memory device will be described below with reference to FIGS. 1A to 1D.

Referring to FIG. 1A, an ONO film 11 (i.e., a dielectric film) is formed on a semiconductor substrate 10. The ONO film 11 is selectively etched by an etch process employing a mask.

Referring to FIG. 1B, a gate oxide film 12 and a polysilicon film 13 are formed on the entire structure.

Referring to FIG. 1C, a photoresist pattern 14 is formed on the entire structure. The photoresist pattern 14 may be misaligned.

Referring to FIG. 1D, the polysilicon film 13, the gate oxide film 12, and the ONO film 11 are etched using the photoresist pattern 14 as a mask, forming a gate 15.

If the gate is formed as described above, there occurs a phenomenon in which the length of the ONO film of a region A is asymmetrical to the length of the ONO film of a region B in the gate 15 due to the misaligned photoresist pattern 14, as shown in FIG. 1C. The length of the ONO film influences the erase rate, the erase efficiency, and the initial threshold voltage (Vt) of the flash memory device. If the length of the ONO film varies depending on a cell of a memory device, respective cells have different threshold voltages (Vt) and different erase rates.

Accordingly, problems arise because the uniformity within the entire wafer is lowered and the threshold voltage (Vt) is severely changed.

SUMMARY OF THE INVENTION

In one embodiment, the invention provides a semiconductor device and a method of manufacturing the same, in which a self-aligned electron trap film in which the lengths of a dielectric film are symmetrical to each other right and left in a gate is formed, thus preventing misalignment by a mask process.

A semiconductor device according to one embodiment of the invention includes a gate oxide film formed on a semiconductor substrate; a third gate electrode formed on the gate oxide film; the whole surface of the third gate electrode other than a top surface being covered with the gate oxide film; first and second dielectric films formed on the semiconductor substrate at both sides of the gate oxide film; first and second gate electrodes which are formed on the first and second dielectric films, respectively, and have a height higher than the third gate electrode; and, a fourth gate electrode which is formed on the gate oxide film and the third gate electrode between the first and second gate electrodes and are electrically connected to the first, second, and third gate electrodes.

According to one embodiment, the invention provides a method of manufacturing a semiconductor device, including the steps of forming a dielectric film on a semiconductor substrate and stripping the dielectric film of a predetermined region; forming an interlayer insulating film on the region from which a portion of the dielectric film has been stripped; forming a first conductive film on the entire structure, and blank etching the first conductive film to form first and second gate electrodes, which are insulated from the semiconductor substrate through the dielectric film, on sidewalls of the interlayer insulating film; stripping the dielectric film exposed between the first and second gate electrodes; forming an oxide film and a second conductive film on the entire structure, and then performing a blanket etch process to form a third gate electrode, which is insulated from the semiconductor substrate and the first and second gate electrodes by means of the oxide film between the first and second gate electrodes; forming a third conductive film on the entire structure, and then performing a blanket etch process to form a fourth gate electrode connected to the first, second, and third gate electrodes; and stripping the interlayer insulating film and then forming a source and drain at given regions of the semiconductor substrate.

BRIEF DESCRIPTION OF THE DRAWINGS

A more compete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF EMBODIMENTS

The invention will now be described in detail in connection with certain exemplary embodiments with reference to the accompanying drawings.

FIGS. 2A to 2I are cross-sectional views illustrating a method of manufacturing a semiconductor device according to an embodiment of the invention.

Figure 1A:
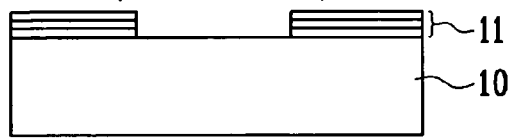
FIGS. 1A to 1D are cross-sectional views illustrating a method of manufacturing a semiconductor device in the related art.
Figure 1B:
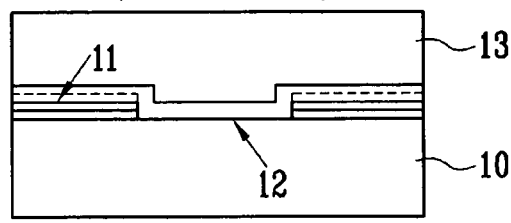
Figure 1C:
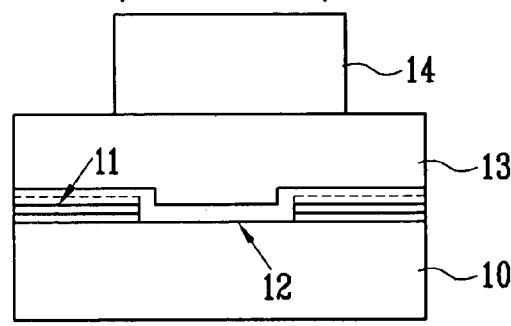
Figure 1D:
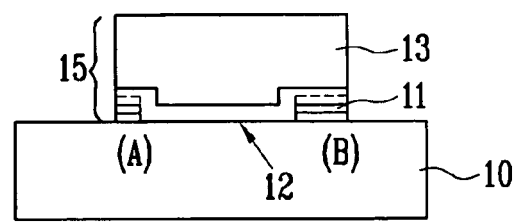
Figure 2A:
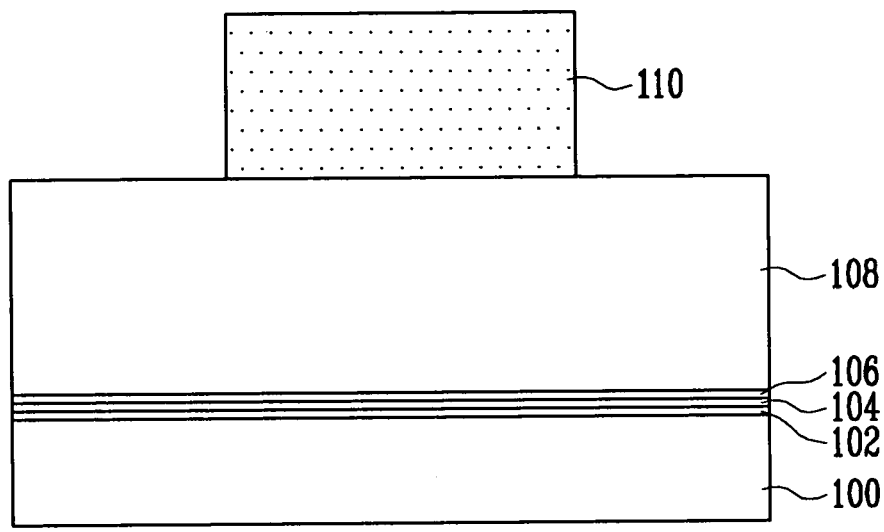
FIGS. 2A to 2I are cross-sectional views illustrating a method of manufacturing a semiconductor device according to an embodiment of the invention.

Referring to FIG. 2A, an ONO film including a first oxide film 102 as a dielectric film, a first nitride film 104, and a second oxide film 106 is formed on a semiconductor substrate 100. The second oxide film 106 may preferably be formed to a thickness of 50 Å to 200 Å by means of a low-pressure chemical vapor deposition (LP-CVD) method or a plasma-enhanced chemical vapor deposition (PE-CVD method. The second oxide film 106 is not used as a material of the ONO film since it is stripped in a subsequent process.

A second nitride film 108 is formed on the ONO film. The second nitride film 108 may preferably be formed to a thickness of 2000 Å to 5000 Å. A photoresist pattern 110 is formed on the second nitride film 108.

Figure 2B:
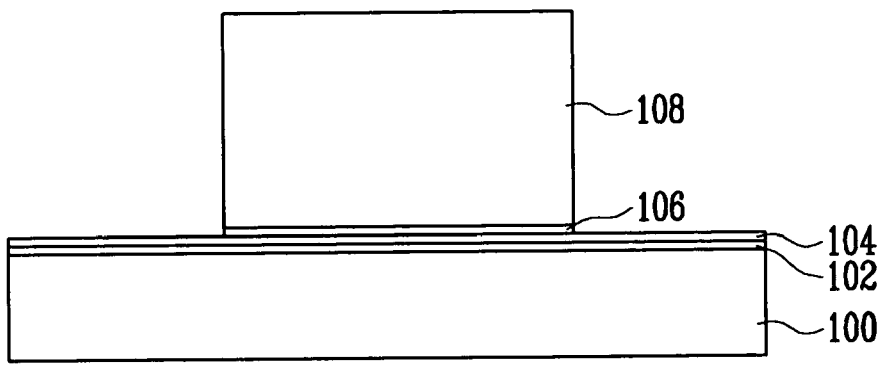

Referring to FIG. 2B, the second nitride film 108 is etched by an etch process using the photoresist pattern 110 as a mask. The exposed second oxide film 106 is stripped. The second nitride film 108 may preferably be etched by a dry etch method.

Figure 2C:
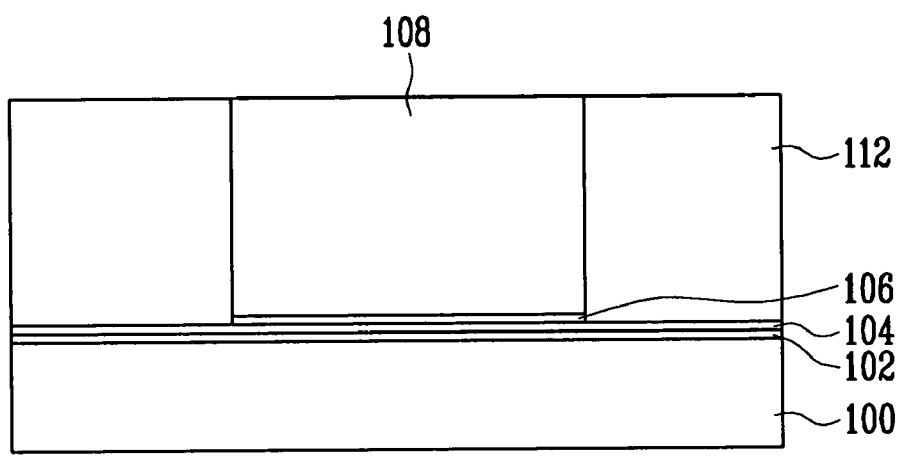

Referring to FIG. 2C, an interlayer insulating film 112 is formed on the entire structure. The interlayer insulating film 112 is polished until a top surface of the second nitride film 108 is exposed. The interlayer insulating film 112 is formed using an oxide film or a $SiO_xN_y$-based material having a fine structure since it is used as a polishing barrier or an etch barrier.

Meanwhile, to form the interlayer insulating film 112 and secure polishing process margin, the second nitride film 108 may be formed to a sufficient thickness.

Figure 2D:
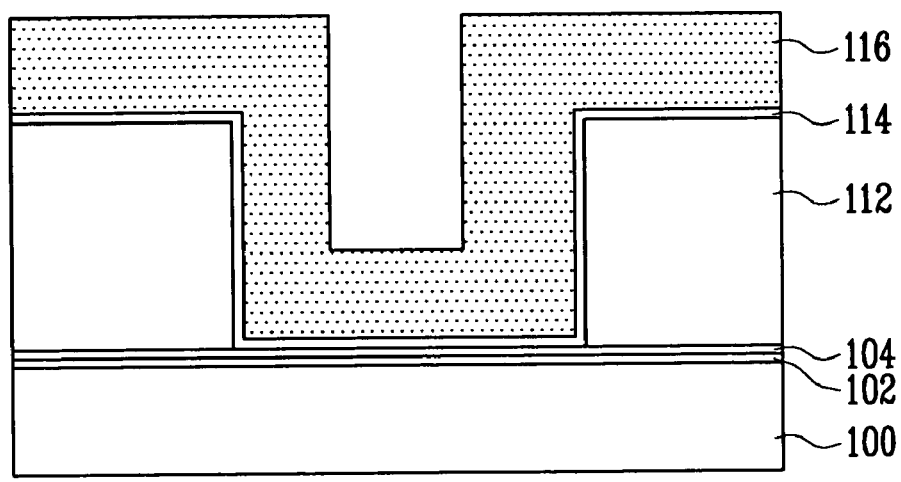

Referring to FIG. 2D, the second nitride film 108 is stripped, preferably using wet etch employing $H_3PO_4$. The second oxide film 106 serves to protect the first nitride film 104 during the wet etch process employing $H_3PO_4$. A cleaning process is performed to strip the second oxide film 106. A third oxide film 114 is formed on the entire structure. The third oxide film 114 is used as the second oxide film of the ONO film.

A cleaning process preferably employing a BF or BOE solution is performed to strip a native oxide film. A first conductive film 116 is then formed on the entire structure. The first conductive film 116 preferably may be formed using a doped polysilicon film, or Al, W, $WSi_x$, $CoSi_x$, $WN_x$, $TiSi_x$, Ti, Ta, TaN, Ru, Pt, or a mixture thereof. The first conductive film 116 may be deposited to have a thickness of ⅕ to ½ of a width of a buried region so that a portion of the buried region can be buried.

Figure 2E:
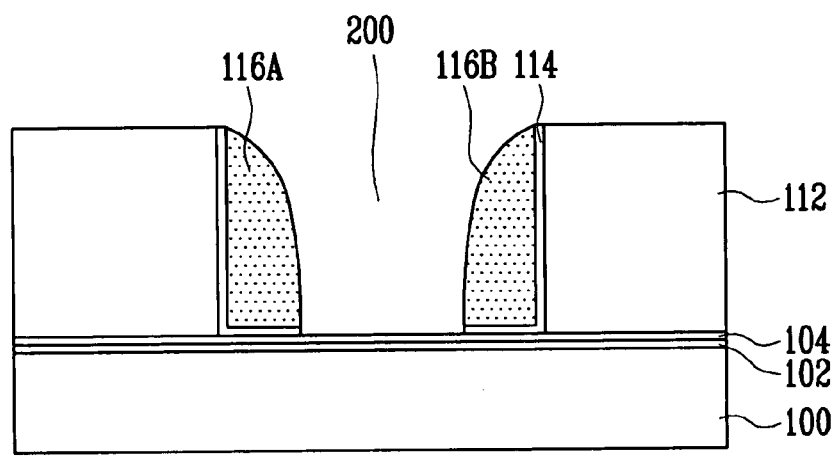

Referring to FIG. 2E, the first conductive film 116 is etched to form first and second gate electrodes 116A and 116B of a spacer shape on the sidewalls of the third oxide film 114. The ONO film between the first gate electrode 116A and the second gate electrode 116B is etched partially or entirely, thereby forming a hole 200.

Figure 2F:
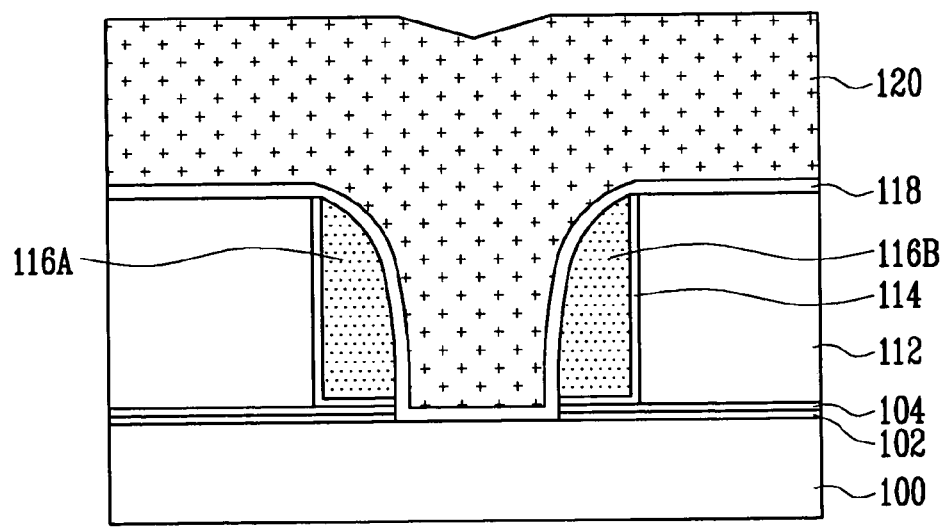

Referring to FIG. 2F, films remaining on the semiconductor substrate 100 between the first gate electrode 116A and the second gate electrode 116B (for example, the first oxide film 102 and the first nitride film 104) are all stripped. A gate oxide film 118 is formed on the entire structure. The gate oxide film 118 may preferably be formed by a LP-CVD method.

A cleaning process employing a BF or BOE solution is performed to strip a native oxide film. A second conductive film 120 is then formed on the entire structure. The second conductive film 120 may preferably be formed using a doped polysilicon film, or Al, W, $WSi_x$, $CoSi_x$, $WN_x$, $TiSi_x$, Ti, Ta, TaN, Ru, Pt, or a mixture thereof. Furthermore, the second conductive film 120 may preferably be formed to a thickness of 500 Å to 5000 Å.

Furthermore, in the case where the second conductive film 120 is formed, the inlet of the hole 200 has a positive slope and can be therefore buried without voids.

Figure 2G:
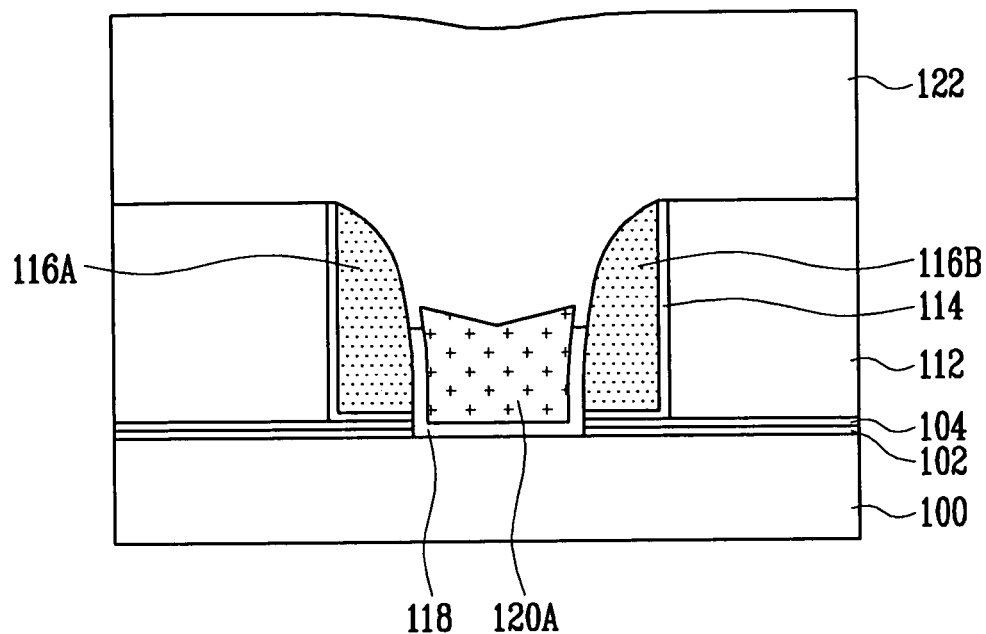

Referring to FIG. 2G, the second conductive film 120 is etched back to form a third gate electrode 120A having a height lower than that of the first and second gate electrodes 116A and 116B. A cleaning process is performed to strip the gate oxide film 118 existing the interlayer insulating film 112, and the first, second, and third gate electrodes 116A, 116B and 120A.

A third conductive film 122 is then formed on the entire structure. The third conductive film 122 may preferably be formed using a doped polysilicon film, or Al, W, $WSi_x$, $CoSi_x$, $WN_x$, $TiSi_x$, Ti, Ta, TaN, Ru, Pt, or a mixture thereof.

Figure 2H:
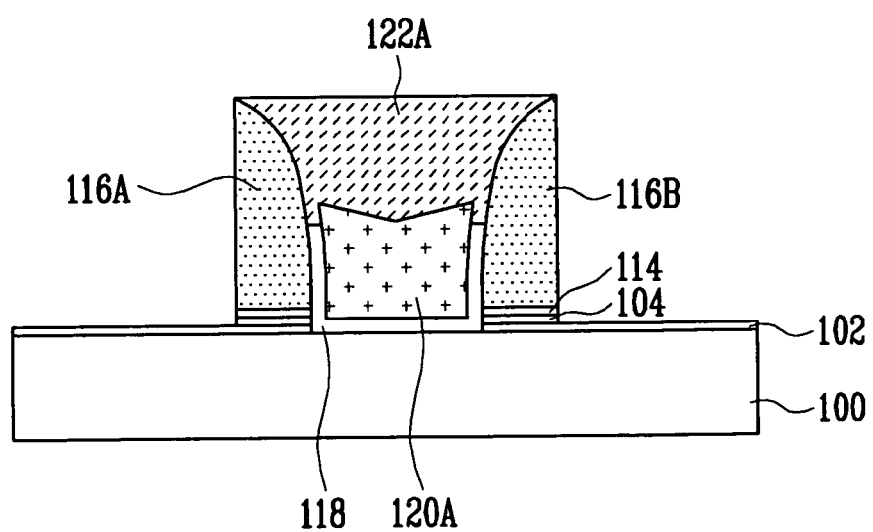

Referring to FIG. 2H, the third conductive film 122 is polished until a top surface of the interlayer insulating film 112 is exposed, thus forming a fourth gate electrode 122A. The interlayer insulating film 112 is stripped by wet etch. When the interlayer insulating film 112 is stripped, the third oxide film 114 and the first nitride film 104 formed on the sidewalls of the first and second gate electrodes 116A and 116B are stripped.

Figure 2I:
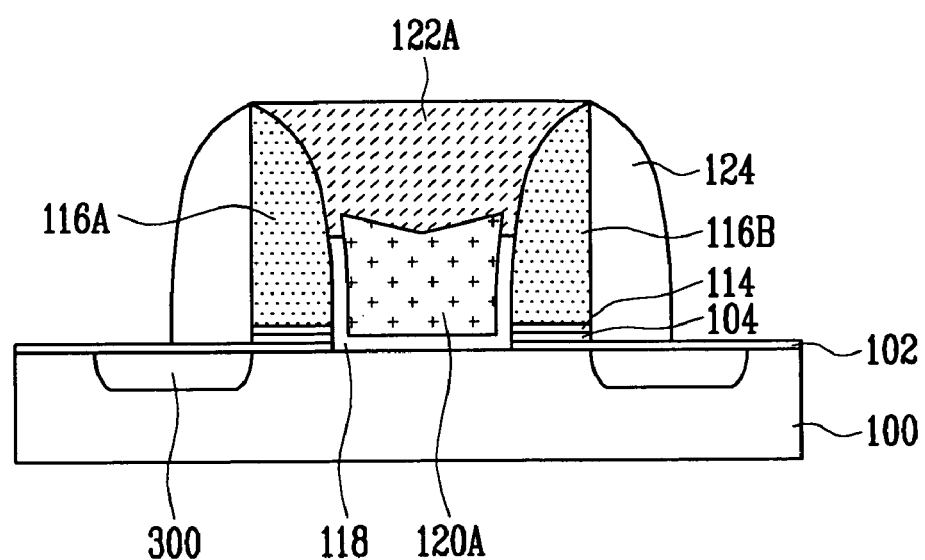

Referring to FIG. 2I, an ion implantation process is performed to form a source and drain 300. Insulating film spacers 124 made of an oxide film or a nitride film are formed on the sidewalls of the first and second gate electrodes 116A and 116B.

In the semiconductor device according to one embodiment of the invention, the gate oxide film is formed on the semiconductor substrate. The third gate electrode is formed on the gate oxide film so that the whole surface of the gate oxide film other than the top surface thereof is covered with the gate oxide film.

The first and second dielectric films are formed on the semiconductor substrate at both sides of the gate oxide film. The first and second gate electrodes are formed on the first and second dielectric films, respectively so that they are higher than the third gate electrode. The fourth gate electrode is formed on the gate oxide film and the third gate electrode between the first and second gate electrode, so that they are electrically connected to the first, second, and third gate electrodes.

As described above, according to the invention, the first gate electrode of the spacer shape is formed on an inner surface of the space. In the event that the second conductive film is to be formed, it can be buried without void due to a positive slope.

Furthermore, the dielectric film is formed in a self-aligned manner by the first gate electrode of the spacer shape without an additional mask process. It is therefore possible to prevent irregular cell configuration due to a misalignment problem incurred by a mask process.

While the invention has been described in connection with practical exemplary embodiments, the invention is not limited to the disclosed embodiments, but, to the contrary, is intended to cover various modifications and equivalent arrangements included within the spirit and scope of the appended claims.

What is claimed is:

1. A method of manufacturing a semiconductor device, the method comprising the steps of:
   forming a dielectric film on a semiconductor substrate and stripping the dielectric film of a predetermined region;
   forming an interlayer insulating film on the region from which a portion of the dielectric film has been stripped;

forming a first conductive film on the entire structure, and blank etching the first conductive film to form first and second gate electrodes, which are insulated from the semiconductor substrate through the dielectric film, on sidewalls of the interlayer insulating film;

stripping the dielectric film exposed between the first and second gate electrodes;

forming an oxide film and a second conductive film on the entire structure, and then performing a blanket etch process to form a third gate electrode, which is insulated from the semiconductor substrate and the first and second gate electrodes by means of the oxide film between the first and second gate electrodes;

forming a third conductive film on the entire structure, and then performing a blanket etch process to form a fourth gate electrode connected to the first, second, and third gate electrodes; and stripping the interlayer insulating film and then forming a source and drain at given regions of the semiconductor substrate.

2. The method of claim 1, comprising forming the interlayer insulating film using an oxide film or a $SiO_xN_y$-based material.

3. The method of claim 1, comprising depositing the first conductive film to have a thickness of ⅕ to ½ of a width of a buried region.

4. The method of claim 1, comprising forming the first, second, third, and fourth gate electrodes using a member selected from the group consisting of doped polysilicon films, Al, W, $WSi_x$, $CoSi_x$, $WN_x$, $TiSi_x$, Ti, Ta, TaN, Ru, Pt, and mixtures thereof.

* * * * *